United States Patent
Rapoport et al.

(10) Patent No.: US 10,809,338 B2
(45) Date of Patent: Oct. 20, 2020

(54) SYSTEM AND METHOD FOR NMR IMAGING OF FLUIDS IN NON-CIRCULAR CROSS-SECTIONAL CONDUITS

(71) Applicant: Aspect AI Ltd., Shoham (IL)

(72) Inventors: Uri Rapoport, Moshav Ben Shemen (IL); Itay Baruchi, Tel Aviv (IL)

(73) Assignee: ASPECT AI LTD., Shoham (IL)

( * ) Notice: Subject to any disclaimer, the term of this patent is extended or adjusted under 35 U.S.C. 154(b) by 391 days.

(21) Appl. No.: 15/563,849

(22) PCT Filed: Apr. 12, 2016

(86) PCT No.: PCT/IL2016/050386
§ 371 (c)(1),
(2) Date: Oct. 2, 2017

(87) PCT Pub. No.: WO2016/166753
PCT Pub. Date: Oct. 20, 2016

(65) Prior Publication Data
US 2018/0095154 A1    Apr. 5, 2018

Related U.S. Application Data

(60) Provisional application No. 62/146,316, filed on Apr. 12, 2015.

(51) Int. Cl.
*G01R 33/563* (2006.01)
*G01R 33/30* (2006.01)
(Continued)

(52) U.S. Cl.
CPC ....... *G01R 33/56308* (2013.01); *G01N 11/02* (2013.01); *G01N 24/08* (2013.01);
(Continued)

(58) Field of Classification Search
CPC ... B01J 2/00; B01J 20/00; B33Y 10/00; B01F 1/00; B01F 5/00; B01F 2201/00
See application file for complete search history.

(56) References Cited

U.S. PATENT DOCUMENTS 2,768,529 A    10/1956    Hagler, Sr.
3,175,403 A    3/1965    Nelson
(Continued)

FOREIGN PATENT DOCUMENTS

CN    1236478    11/1999
CN    1291873    4/2001
(Continued)

OTHER PUBLICATIONS

Yan, Jienian, Drilling Fluids Technology, May 31, 2001, China University of Petroleum Press, pp. 61-66.
(Continued)

*Primary Examiner* — Jermele M Hollington
*Assistant Examiner* — Temilade S Rhodes-Vivour
(74) *Attorney, Agent, or Firm* — Loeb & Loeb LLP

(57) ABSTRACT

A Nuclear magnetic Resonance (NMR)-based system for measuring physical properties of a fluid, the system comprising an NMR spectrometer, configured to allow subjection of the fluid to radio frequency (RF) signals within a generated magnetic field, measurement of RF signals remitted by the fluid, and production of an NMR image of the fluid, a conduit, with a at least one segment of non-circular cross-section for accommodation of the flow of the fluid, and a flow-inducing mechanism, configured to allow generation of the flow of the fluid within the conduit, wherein the computer processor is configured to allow analytic processing of data related to the physical properties of the fluid under conditions of laminar and mixed laminar-turbulent flow through the conduit of non-circular cross-section so as
(Continued)

to allow measurement of shear stress and shear rate of the fluid.

24 Claims, 5 Drawing Sheets

(51) Int. Cl.
  *G01N 24/08* (2006.01)
  *G01N 11/02* (2006.01)
  *G01N 15/02* (2006.01)
  *G01V 3/08* (2006.01)

(52) U.S. Cl.
  CPC ......... *G01N 24/085* (2013.01); *G01R 33/307* (2013.01); *G01N 15/0227* (2013.01); *G01V 3/081* (2013.01)

(56) References Cited

U.S. PATENT DOCUMENTS

| | | |
|---|---|---|
| 3,989,630 A | 11/1976 | Walker |
| 4,417,474 A | 11/1983 | Elderton |
| 4,468,622 A | 8/1984 | Frese et al. |
| 4,697,594 A | 10/1987 | Mayo, Jr. |
| 4,904,603 A | 2/1990 | Jones et al. |
| 4,994,746 A | 2/1991 | Panosh |
| 5,023,551 A | 6/1991 | Kleinberg et al. |
| 5,145,189 A | 9/1992 | Pope |
| 5,161,409 A | 11/1992 | Hughes et al. |
| 5,168,226 A | 12/1992 | Hinks |
| 5,208,534 A | 5/1993 | Okamoto et al. |
| 5,280,243 A | 1/1994 | Miler |
| 5,306,909 A | 4/1994 | Jones et al. |
| 5,479,925 A | 1/1996 | Dumoulin et al. |
| 5,532,593 A | 7/1996 | Maneval et al. |
| 5,557,103 A | 9/1996 | Hughes et al. |
| 5,557,201 A | 9/1996 | Kleinberg et al. |
| 5,696,448 A | 12/1997 | Coates et al. |
| 5,705,927 A | 1/1998 | Sezginer et al. |
| 5,757,187 A | 5/1998 | Wollin |
| 5,784,333 A | 7/1998 | Tang et al. |
| 5,827,952 A | 10/1998 | Mansure et al. |
| 5,986,454 A | 11/1999 | Leifer |
| 6,069,106 A | 5/2000 | Hettinger, Jr. |
| 6,090,728 A | 7/2000 | Yenni, Jr. et al. |
| 6,107,796 A | 8/2000 | Prammer |
| 6,178,807 B1 | 1/2001 | Baldwin et al. |
| 6,215,304 B1 | 4/2001 | Slade |
| 6,268,726 B1 | 7/2001 | Prammer et al. |
| 6,362,619 B2 | 3/2002 | Prammer et al. |
| 6,412,337 B1 | 7/2002 | Arzate et al. |
| 6,421,337 B1 | 7/2002 | Rao et al. |
| 6,452,390 B1 | 9/2002 | Wollin |
| 6,507,191 B1 | 1/2003 | Eguchi et al. |
| 6,518,758 B1 | 2/2003 | Speier et al. |
| 6,549,007 B1 | 4/2003 | Hills et al. |
| 6,550,327 B1 | 4/2003 | Van Berk |
| 6,646,437 B1 | 11/2003 | Chitale et al. |
| 6,807,857 B2 | 10/2004 | Storm, Jr. et al. |
| 6,856,132 B2 | 2/2005 | Appel et al. |
| 6,907,375 B2 | 6/2005 | Guggari et al. |
| 6,913,827 B2 | 7/2005 | George et al. |
| 6,952,096 B2 | 10/2005 | Freedman |
| 7,075,366 B2 | 7/2006 | Deem et al. |
| 7,295,933 B2 | 11/2007 | Gysling et al. |
| 7,352,179 B2 | 4/2008 | Chen et al. |
| 7,486,071 B2 | 2/2009 | Care et al. |
| 7,489,132 B2 | 2/2009 | Arik et al. |
| 7,491,173 B2 * | 2/2009 | Heim .................... A61B 5/026 600/504 |
| 7,570,058 B1 | 8/2009 | Wong et al. |
| 7,823,656 B1 | 11/2010 | Williams |
| 7,908,034 B2 | 3/2011 | Gray |
| 7,921,731 B2 | 4/2011 | Bajikar et al. |
| 8,024,962 B2 | 9/2011 | Tonmukayakul et al. |
| 8,143,887 B2 | 3/2012 | Pusiol |
| 8,256,532 B2 | 9/2012 | Gray |
| 8,373,412 B2 | 2/2013 | Kruspe et al. |
| 8,461,842 B2 | 6/2013 | Thuringer et al. |
| 8,469,118 B2 | 6/2013 | Passade-Boupat et al. |
| 8,610,895 B1 * | 12/2013 | Irani .................... G01N 21/314 356/445 |
| 8,736,263 B2 | 5/2014 | Minh |
| 8,763,170 B1 | 7/2014 | Ungarsohn |
| 8,763,710 B2 | 7/2014 | Graue |
| 8,791,695 B2 | 7/2014 | Balcom et al. |
| 8,807,084 B2 | 8/2014 | Rapoport et al. |
| 8,812,236 B1 | 8/2014 | Freeman et al. |
| 8,851,018 B2 | 10/2014 | Rapoport et al. |
| 8,896,310 B2 | 11/2014 | Rapoport |
| 9,194,972 B2 | 11/2015 | Van Der Zwaag et al. |
| 9,448,093 B2 | 9/2016 | Rapoport |
| 9,476,847 B2 | 10/2016 | Trygstad et al. |
| 2002/0019023 A1 * | 2/2002 | Dasseux ............ G01N 33/5008 435/40 |
| 2002/0173717 A1 | 11/2002 | Rohling et al. |
| 2003/0006768 A1 | 1/2003 | Kleinberg et al. |
| 2004/0017193 A1 | 1/2004 | Speier |
| 2004/0090230 A1 | 5/2004 | Appel et al. |
| 2004/0108852 A1 | 6/2004 | De Swiet |
| 2004/0116799 A1 | 6/2004 | Srinivasan |
| 2004/0127786 A1 | 7/2004 | Schmit et al. |
| 2004/0140800 A1 | 7/2004 | Madio et al. |
| 2004/0169512 A1 | 9/2004 | Jara |
| 2005/0011283 A1 | 1/2005 | Gysling et al. |
| 2005/0024053 A1 | 2/2005 | Care et al. |
| 2005/0030020 A1 | 2/2005 | Siess et al. |
| 2005/0044957 A1 | 3/2005 | Muldowney |
| 2005/0087122 A1 * | 4/2005 | Ismagliov ............ B01F 5/0646 117/2 |
| 2005/0203420 A1 | 9/2005 | Kleen et al. |
| 2006/0011547 A1 | 1/2006 | Bell |
| 2006/0279283 A1 | 12/2006 | Nistler et al. |
| 2007/0061081 A1 | 3/2007 | Moran |
| 2007/0164737 A1 | 7/2007 | Pusiol |
| 2007/0188172 A1 | 8/2007 | Garwood et al. |
| 2008/0136049 A1 | 6/2008 | Sen et al. |
| 2008/0136409 A1 | 6/2008 | Sen et al. |
| 2008/0174309 A1 | 7/2008 | Pusiol et al. |
| 2008/0180226 A1 | 7/2008 | Schmidt |
| 2008/0189456 A1 | 8/2008 | Schmidt et al. |
| 2008/0257413 A1 | 10/2008 | Noureldin et al. |
| 2009/0004748 A1 | 1/2009 | Ganesan |
| 2009/0044638 A1 | 2/2009 | Gysling et al. |
| 2009/0050318 A1 | 2/2009 | Kasevich |
| 2009/0050369 A1 | 2/2009 | Pop et al. |
| 2009/0072824 A1 | 3/2009 | Romero |
| 2009/0090504 A1 | 4/2009 | Weightman et al. |
| 2009/0194330 A1 | 8/2009 | Gray |
| 2009/0312963 A1 | 12/2009 | Najim Al-Khamis |
| 2009/0312964 A1 | 12/2009 | Najim Al-Khamis |
| 2010/0133488 A1 | 6/2010 | Giakos |
| 2010/0154325 A1 | 6/2010 | Boesel et al. |
| 2010/0264914 A1 | 10/2010 | Minh |
| 2010/0271019 A1 | 10/2010 | Anand et al. |
| 2011/0036584 A1 | 2/2011 | Weightman et al. |
| 2011/0125333 A1 | 5/2011 | Gray |
| 2011/0162652 A1 | 7/2011 | Rapoport |
| 2011/0185795 A1 | 8/2011 | Colquhoun |
| 2011/0186049 A1 | 8/2011 | Rapoport |
| 2011/0234347 A1 | 9/2011 | Rapoport |
| 2011/0270525 A1 | 11/2011 | Hunter |
| 2011/0296911 A1 | 12/2011 | Moore et al. |
| 2011/0304333 A1 | 12/2011 | Rapoport |
| 2012/0013335 A1 | 1/2012 | Saasen et al. |
| 2012/0024602 A1 | 2/2012 | Larson |
| 2012/0065491 A1 | 3/2012 | Borgert et al. |
| 2012/0071745 A1 | 3/2012 | Rapoport |
| 2012/0073511 A1 | 3/2012 | Rapoport et al. |
| 2012/0077707 A1 | 3/2012 | Rapoport |
| 2012/0092007 A1 | 4/2012 | Li et al. |
| 2012/0119742 A1 | 5/2012 | Rapoport |
| 2012/0205288 A1 | 8/2012 | Jia et al. |

(56) References Cited

U.S. PATENT DOCUMENTS

| | | |
|---|---|---|
| 2012/0212224 A1 | 8/2012 | Burns |
| 2012/0265050 A1 | 10/2012 | Wang |
| 2013/0009959 A1 | 1/2013 | Calamante et al. |
| 2013/0025062 A1 | 1/2013 | Esch |
| 2013/0060474 A1 | 3/2013 | Venkataramanan et al. |
| 2013/0079624 A1 | 3/2013 | Rapoport |
| 2013/0090855 A1 | 4/2013 | Rasmus et al. |
| 2013/0091941 A1 | 4/2013 | Huh et al. |
| 2013/0109956 A1 | 5/2013 | Rapoport |
| 2013/0123639 A1 | 5/2013 | Ando |
| 2013/0124106 A1 | 5/2013 | Rogel et al. |
| 2013/0154644 A1 | 6/2013 | Virtanen et al. |
| 2013/0179092 A1 | 7/2013 | Martin et al. |
| 2013/0237803 A1 | 9/2013 | Rapoport |
| 2013/0271135 A1 | 10/2013 | Ozen et al. |
| 2013/0328559 A1 | 12/2013 | Rapoport |
| 2013/0328560 A1 | 12/2013 | Rapoport |
| 2013/0328563 A1 | 12/2013 | Rapoport |
| 2013/0345994 A1 | 12/2013 | Wiklund et al. |
| 2014/0049257 A1* | 2/2014 | Rapoport ............... G01F 1/716 324/306 |
| 2014/0050824 A1 | 2/2014 | Rapoport |
| 2014/0050827 A1 | 2/2014 | Rapoport |
| 2014/0051973 A1 | 2/2014 | Rapoport et al. |
| 2014/0051974 A1 | 2/2014 | Rapoport et al. |
| 2014/0051976 A1 | 2/2014 | Rapoport et al. |
| 2014/0099010 A1 | 4/2014 | Rapoport |
| 2014/0103927 A1 | 4/2014 | Rapoport |
| 2014/0117989 A1 | 5/2014 | Rapoport |
| 2014/0128725 A1 | 5/2014 | Rapoport |
| 2014/0139216 A1 | 5/2014 | Rapoport |
| 2014/0142914 A1 | 5/2014 | Rapoport |
| 2014/0152302 A1 | 6/2014 | Rapoport et al. |
| 2014/0152310 A1 | 6/2014 | Rapoport |
| 2014/0158062 A1 | 6/2014 | Rapoport et al. |
| 2014/0230850 A1 | 8/2014 | Rapoport |
| 2014/0253116 A1 | 9/2014 | Freedman et al. |
| 2014/0257081 A1 | 9/2014 | Rapoport |
| 2014/0262957 A1 | 9/2014 | Gong et al. |
| 2014/0266203 A1 | 9/2014 | Rapoport |
| 2014/0300358 A1 | 10/2014 | Rapoport |
| 2014/0309951 A1 | 10/2014 | Alvarez Vallejos et al. |
| 2014/0333304 A1 | 11/2014 | Jensen |
| 2014/0354299 A1 | 12/2014 | Rapoport |
| 2014/0378821 A1 | 12/2014 | Rapoport et al. |
| 2014/0378825 A1 | 12/2014 | Rapoport et al. |
| 2015/0059157 A1 | 3/2015 | Rapoport |
| 2015/0059655 A1 | 3/2015 | Rapoport |
| 2015/0065788 A1 | 3/2015 | Rapoport |
| 2015/0084630 A1 | 3/2015 | Rapoport |
| 2015/0087051 A1 | 3/2015 | Rapoport |
| 2015/0112186 A1 | 4/2015 | Rapoport et al. |
| 2015/0130460 A1 | 5/2015 | Valori et al. |
| 2015/0137812 A1 | 5/2015 | Rapoport |
| 2015/0141799 A1 | 5/2015 | Rapoport et al. |
| 2015/0168519 A1 | 6/2015 | Rapoport |
| 2015/0212045 A1* | 7/2015 | Raykhman ............... G01F 1/74 73/32 A |
| 2015/0268374 A1 | 9/2015 | Rapoport |
| 2015/0320888 A1 | 11/2015 | Yoneda et al. |
| 2015/0357694 A1 | 12/2015 | Denis et al. |
| 2015/0377998 A1 | 12/2015 | Bendel |
| 2016/0053187 A1 | 2/2016 | Hayasaka et al. |
| 2016/0108687 A1 | 4/2016 | Rapoport |
| 2016/0109539 A1 | 4/2016 | Mardor et al. |
| 2017/0243681 A1 | 8/2017 | Somerkoski et al. |

FOREIGN PATENT DOCUMENTS

| | | |
|---|---|---|
| CN | 1422324 | 6/2003 |
| CN | 1427877 | 7/2003 |
| CN | 1590994 | 3/2005 |
| CN | 101421636 | 4/2009 |
| CN | 101556234 | 10/2009 |
| CN | 10158717 | 11/2009 |
| CN | 101632584 | 1/2010 |
| CN | 101793147 | 8/2010 |
| CN | 101907586 | 12/2010 |
| CN | 103207200 A | 7/2013 |
| CN | 103217362 | 7/2013 |
| CN | 103411991 A | 11/2013 |
| CN | 103542899 | 1/2014 |
| CN | 103712071 | 4/2014 |
| CN | 103954639 | 7/2014 |
| DE | 202014105273 | 11/2014 |
| EP | 0 210 289 | 2/1987 |
| EP | 0770660 | 5/1997 |
| EP | 0835463 | 8/2003 |
| EP | 1532460 | 5/2005 |
| EP | 2604996 | 6/2013 |
| EP | 2927420 A2 | 10/2015 |
| EP | 2927420 A3 | 2/2016 |
| GB | 2341685 A | 7/1999 |
| RU | 2229023 | 5/2004 |
| RU | 2285119 | 10/2006 |
| RU | 2367982 | 9/2009 |
| SU | 876954 | 10/1981 |
| SU | 1041677 | 9/1983 |
| WO | WO1995018387 | 7/1995 |
| WO | WO2001002832 | 1/2001 |
| WO | WO2001051588 | 7/2001 |
| WO | WO2001051589 | 7/2001 |
| WO | WO2008008447 | 1/2008 |
| WO | WO2008043373 | 4/2008 |
| WO | WO2010000055 | 1/2010 |
| WO | WO2011095600 | 8/2011 |
| WO | WO2012004797 | 1/2012 |
| WO | WO2013009299 | 1/2013 |
| WO | WO2013162400 | 10/2013 |
| WO | WO2013179092 | 12/2013 |
| WO | WO2014004573 | 1/2014 |
| WO | 2014027350 | 2/2014 |
| WO | 2014027350 A1 | 2/2014 |
| WO | WO2014203245 | 12/2014 |
| WO | WO2015070872 | 5/2015 |

OTHER PUBLICATIONS

ANSI/ISA SP76.00.2002 Miniature, Modular Mechanical Standard Specifications, 2002.

Arola et al., Use of nuclear magnetic resonance imaging as a viscometer for process monitoring, Chemical Engineering Science, 1997, 52(13), 2049-2057.

Bennett, et al. A nondestructive technique for determining thermal properties of thermal barrier coatings, Journal of Applied Physics, 2005, 97, 013520, 1-12.

Bird et al. Transport Phenomena, Chapter. 2, Shell momentum balances and velocity distributions in laminar flow, Dec. 31, 2002, XP-002768172, Wiley, p. 54.

Caprihan, et al. Flow measurements by NMR, Physics Reports, (Review Section of Physics Letters)1990, 198, No. 4, 195-235.

Coussot et al., Rheological behavior of drilling muds, characterization using MRI visualization, Oil & Gas Science and Technology, Rev. IFP, 2004, vol. 59, No. 1, 23-29.

Degre et al., Rheology of complex fluids by particle image velocimetry in microchannels, Appl. Phys. Lett. 89(2), 024104, 2006, 1-3.

Doble et al., Optimization of the relaxivity of MRI contrast agents: effects of poly(ethylene glycol) chains on the water-exchange rates of Gd complexes, J. Am. Chem. Soc. 2001, 123, 10758-10759.

Dogan et al., Measurement of polymer melt rheology using ultrasonics-based in-line rheometry, Meas. Sci. Technol.,2005, 16(8):1684-1690.

Dyverfeldt et al., Quantification of intravoxel velocity standard deviation and turbulence intensity by generalizing phase-contrast MRI, Magnetic Resonance in Medicine, 2006, 56:850-858.

Felemban, et al. RFID for Oil and Gas Industry: Applications and Challenges, International Journal of Engineering and Innovative Technology (IJEIT) vol. 3, Issue 5, Nov. 2013, 20-85.

Goloshevsky et al., Nuclear magnetic resonance imaging for viscosity measurements of non-Newtonian fluids using a miniaturized RF coil, Meas. Sci. Technol., 2005, 16:513-518.

(56) References Cited

OTHER PUBLICATIONS

Gunnerod et al., Highly automated drilling fluids system improves HSE and efficiency, reduced personnel needs, Drilling Contractor, Heath, Safety & Environment, Jan./Feb. 2009, 73-77.

Guzel et al., Predicting laminar-turbulent transition in Poiseuille pipe flow for non-Newtonian fluids, Chemical Engineering Science 2009, 64 (2) 254-264.

Hou et al., Review Article, Instrument techniques for rheometry, Review of Scientific Instruments, 2005, 76, 101101, 1-19.

Hsu et al., Encoding to the longitudinal magnetization for MR imaging and flow velocity mapping, Journal of Magnetic Resonance, 2006, 183, 41-49.

International Electromechanical Commission in publication, IEC 62339-1:2006, 2006.

Kose, Katsumi, Visualization of local shearing motion in turbulent fluids using echo-planar imaging, Journal of Magnetic Resonance, 1992, 96, 596-603.

Lucas et al., An Iterative Image Registration Technique with an Application to Stereo Vision, Proceedings of Imaging Understanding Workshop, pp. 121-130 (1981).

Macgowan et al., Fast measurements of the motion and velocity spectrum of blood using MR tagging, Magnetic Resonance in Medicine, 2001, 45:461-469.

Ocali et al., Ultimate intrinsic signal-to-noise ratio in MRI, MRM, 1998, 39:462-473.

Pohost et al., Nuclear magnetic resonance imaging: With or without nuclear?, JACC Mar. 1986, vol. 7, No. 3, 709-710.

Poole et al., Development-Length Requirements for Fully Developed Laminar Pipe Flow of Inelastic Non-Newtonian Liquids, Journal of Fluids Engineering, Oct. 2007, vol. 129, 1281-1287.

Poulichet et al., Optimisation and realisation of a portable NMR apparatus and Micro Antenna for NMR, DTIP, May 2011, 11-13, Aix-en-Provence, France.

Prammer et al., The magnetic resonance while-drilling tool: theory and operation, Society of Engineers, 2000, SPE62981, 1-8.

Rabideau et al., The extrusion of a model yield stress fluid imaged by MRI velocimetry, J. Non-Newtonian Fluid Mech, 2010, 165, 394-408.

Shadday Jr., M.A., Recommendations for rheological testing and modelling of DWPF meter feed slurries (U), Engineering & Materials Technology Dept., WSRC-TR-94-0357, 1994 pp. 1-45.

Bradley Jr. et al., The appearance of rapidly flowing blood on magnetic resonance images, AJR, Dec. 1984, 143:1167-1174.

Chinese Office Action (with English language translation) for App No. CN201510424003.2, dated Apr. 14, 2020, 18 pages.

Chinese Office Action (with English language translation) for Application No. CN201510420515.1, dated Jan. 6, 2020, 13 pages.

Li et al., Pipe flow of aqueous polyacrylamide solutions studies by means of nuclear magnetic resonance imaging, J. Non-Newtonian Fluid Mech., 57 (1995) 155-175.

Shao Weizhi, Gui Xinghai, Hao Liping,et al. Analysis of Limitation in Reservoir Fluid Identification by Using Nuclear Magnetic Resonance Logging J]. Well Logging Technology, 2014, 38(06). pp. 84-689, 703 [absract].

\* cited by examiner

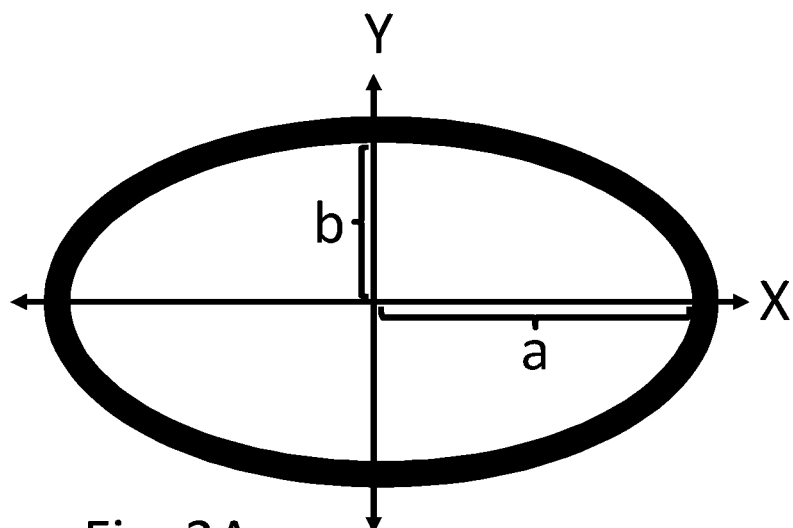
Fig. 2A
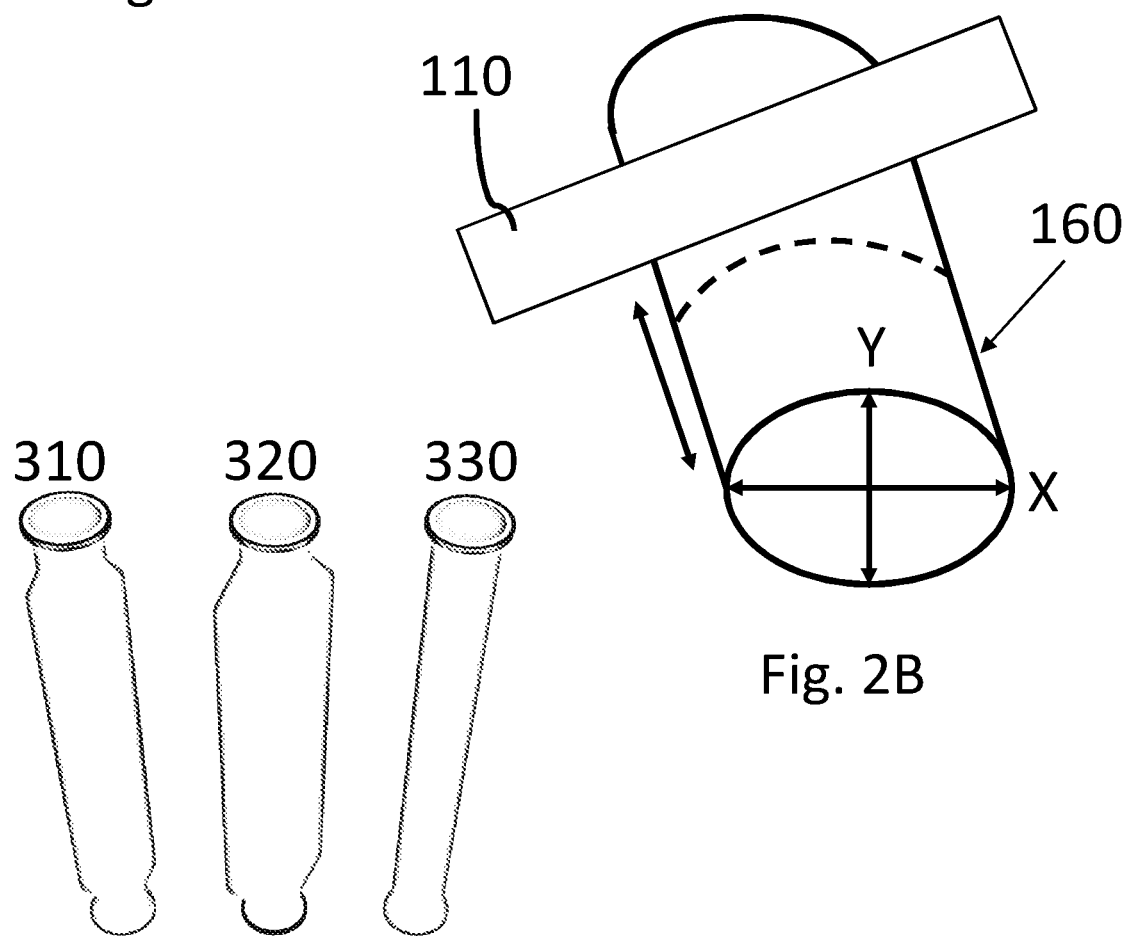
Fig. 2B
Fig. 3

SYSTEM AND METHOD FOR NMR IMAGING OF FLUIDS IN NON-CIRCULAR CROSS-SECTIONAL CONDUITS

FIELD OF THE INVENTION

The present invention relates to Nuclear Magnetic Resonance (NMR) based systems. More particularly, the present invention relates to systems and methods for analyzing by NMR-based systems properties of fluids flowing through conduits of non-circular cross-sections.

BACKGROUND OF THE INVENTION

The observation and analysis of complex fluid flow behavior provide valuable insights into the physical properties of substances. As such, they have become important factors in the control and optimization of industrial processes. Examples of these processes include, but are not limited to, exploratory oilfield drilling, fluid transport, and processed food production.

In the oil industry, rheological and compositional properties of drilling fluid, circulated down the drilling conduit and back up the annulus of the borehole surrounding the drilling conduit, provide essential process control information. This information often results in real time process changes in the composition of the drilling fluid or in drilling parameters such as drilling speed and weight-on-bit. Given the nature of oilfield drilling operations, such control decisions may have financial ramifications in the tens of millions of dollars.

In recent years, nuclear magnetic resonance (NMR) imaging has become recognized for its value as a highly-sensitive and non-invasive methodology for collecting data on complex fluid flow and fluid mobility properties. The MRI images provide velocity profiles of the flow in the conduit, from which one can obtain shear rates across the conduit profile. Together with the measurement of the pressure drop between two edges of the conduit, a relation between shear rate and shear stress are obtained. In the case of developed, laminar flow, the shear rate shear stress relations provide the classical rheogram from which viscosity and viscoelasticity are achieved. For the sake of simplicity we consider a simple Newtons fluid in a laminar flow. In the case of simple, Newtons fluid run in a laminar flow, a velocity profile across the conduit's diameter, defined with a radius R, for any point at distance 'r' (at a cross-section of the flow, e.g. in a conduit), may be expressed by:

$$V(r) = V_{max} \cdot \left(1 - \frac{r^2}{R^2}\right),$$

wherein the maximal velocity $V_{max}$ is defined by the flow rate.

The shear rates, denoted $\dot{\gamma}(r)$, between the velocity layers of the flow, may be calculated by:

$$\dot{\gamma}(r) = \frac{\partial V(r)}{\partial r} = 2V_{max} \frac{r}{R^2}$$

wherein the shear rate is limited by the radius 'R' (of the conduit) and the flow rate.

In general, as long as the flow is laminar, the highest shear rate range that can be given, the more details about the fluid can be obtained. As can be seen in the expression for shear rate above, it is possible to get better shear rate resolution by increasing radius 'R'. However in order to get better range of shear rates, radius 'R' should be decreased.

So for each fluid, there would be a tradeoff between shear rate range and resolution, and different conduit geometry would be optimized.

However, not in all situations, replacing the conduit during the measurements is possible. There is therefore a clear need for a solution for observing and analyzing fluid flowing with laminar-turbulent transition flow zones of varying relative size that is capable of providing enhanced resolution and range of shear rate.

SUMMARY OF THE INVENTION

There is thus provided, in accordance with a preferred embodiment of the invention, a Nuclear magnetic Resonance (NMR)-based system for measuring physical properties of a fluid, the system comprising an NMR spectrometer, configured to allow subjection of the fluid to radio frequency (RF) signals within a generated magnetic field, measurement of RF signals re-emitted by the fluid, and production of an NMR image of the fluid, a computer processor, configured to allow control of the RF wave generation and detection functions of the NMR spectrometer, a conduit, with a at least one segment of non-circular cross-section for accommodation of the flow of the fluid, and a flow-inducing mechanism, configured to allow generation of the flow of the fluid within the conduit, wherein the computer processor is configured to allow analytic processing of data related to the physical properties of the fluid under conditions of laminar and mixed laminar-turbulent flow through the conduit of non-circular cross-section so as to allow measurement of shear stress and shear rate of the fluid.

Furthermore, in accordance with a preferred embodiment of the present invention, the computer processor is configured to allow fitting the physical parameters of the conduit to parameters of a circular conduit, so as to allow analyzing flow in a circular conduit.

Furthermore, in accordance with a preferred embodiment of the present invention, the system further comprises a computer-readable medium for storing machine instructions for the computer processor and for storing information pertaining to the measurement of the RF signals, and a digital electronic connection port for digital communication between the NMR-based system and a computer communication network, wherein the computer-readable medium comprises a plurality of steps to be executed by the computer processor for the analytic processing of data related to the physical properties of the fluid under conditions of laminar and mixed laminar-turbulent flow through the conduit of non-circular cross-section.

Furthermore, in accordance with a preferred embodiment of the present invention, the system further comprises a visual display for indicating the current state and function of the NMR-based system.

Furthermore, in accordance with a preferred embodiment of the present invention, the radius of the conduit is in the range of 2-50 millimeters.

Furthermore, in accordance with a preferred embodiment of the present invention, the physical properties of a flowing substance measured by the NMR-based system comprise at least one of the concentration and the identification of at least one material as well as the material's particle size, particle size distribution, particle shape, dynamic flow characteristics, water content, electrochemical and/or chemical properties of conductivity, dielectric constant, and magnetic properties.

Furthermore, in accordance with a preferred embodiment of the present invention, the specification of the non-circular cross-section of the conduit results in predicted zones of laminar, turbulent, and mixed laminar-turbulent fluid flow within the conduit.

Furthermore, in accordance with a preferred embodiment of the present invention, the conduit is configured on-line, accommodating a flow of the fluid that is parallel to the fluid flow of an industrial process.

Furthermore, in accordance with a preferred embodiment of the present invention, the non-circular cross-section of the conduit has a cross-sectional elliptical shape, and the fluid velocity profile through the cross-section, $v_z$, is described by the expression, $$v_z = \frac{2Q}{\pi ab}\left(1 - \frac{x^2}{a^2} - \frac{y^2}{b^2}\right),$$

in Cartesian coordinates, where Q is the rate of total flow of the fluid through the conduit, "a" is the conduit's radius along the x-axis, and "b" is the conduit's radius along the y-axis, and the velocity differential at different x,y coordinates along the cross-section correlates to laminar flow within the conduit.

Furthermore, in accordance with a preferred embodiment of the present invention, the conduit of elliptical cross-section is configured in-line, as an integral, serial part of an industrial process wherein the physical properties of the fluid are monitored.

Furthermore, in accordance with a preferred embodiment of the present invention, the conduit of elliptical cross-section is one of a plurality of conduits having cross section with different values of elliptical eccentricity, e, ranging from a minimum of 0 to a maximum of 0.98.

Furthermore, in accordance with a preferred embodiment of the present invention, the conduit of elliptical cross-section is one of a plurality of conduits comprising inner walls of various degrees of surface roughness, producing various levels of turbulence of the fluid flow within the conduit, operationally matched to parameters of the analytic processing of data.

Furthermore, in accordance with a preferred embodiment of the present invention, the system further comprises an RF generation module that is configured to allow generation of RF signals.

Furthermore, in accordance with a preferred embodiment of the present invention, a method for measuring physical properties of a fluid with a Nuclear magnetic Resonance (NMR)-based system with a conduit having at least one segment of non-circular cross-section is provided, the method comprising accommodating the flow of the fluid within the conduit, subjecting the fluid to radio frequency signals within a magnetic field generated by an NMR spectrometer, and measuring radio frequency signals re-emitted by the fluid with the NMR spectrometer, producing an NMR image of the fluid, and processing data related to physical properties of the fluid flow through the conduit of non-circular cross-section so as to allow characterization of the flow conditions as one of laminar, turbulent and mixed laminar-turbulent flow.

Furthermore, in accordance with a preferred embodiment of the present invention, the processing is further configured to allow measurement of shear stress and shear rate of the fluid.

Furthermore, in accordance with a preferred embodiment of the present invention, the produced NMR image comprises a three dimensional profile of flow velocity within the conduit, and wherein the profile is configured to allow characterization of the flow conditions as one of laminar, turbulent and mixed laminar-turbulent flow.

Furthermore, in accordance with a preferred embodiment of the present invention, the method further comprises fitting the physical parameters of the conduit to parameters of a circular conduit, so as to allow analyzing flow in a circular conduit.

Furthermore, in accordance with a preferred embodiment of the present invention, the method further comprises generating the flow of the fluid within the conduit using a flow-inducing mechanism, controlling the RF wave generation and detection functions of the NMR spectrometer using a computer processor, storing machine instructions for the computer processor on a computer-readable medium and storing information pertaining to the measurement of the RF signals on the computer-readable medium, and facilitating digital communication between the computer processor and a computer communication network via a digital electronic connection port.

Furthermore, in accordance with a preferred embodiment of the present invention, the method further comprises indicating the current state and function of the NMR imaging process on a visual display.

Furthermore, in accordance with a preferred embodiment of the present invention, the method further comprises generating radio frequency signals with a radio frequency generation module.

Furthermore, in accordance with a preferred embodiment of the present invention, the processing data related to the measured physical properties of a flowing substance comprises at least one of determining the concentration and the identification of at least one material as well as the material's particle size, particle size distribution, particle shape, dynamic flow characteristics, water content, electrochemical and/or chemical properties of conductivity, dielectric constant, and magnetic properties.

Furthermore, in accordance with a preferred embodiment of the present invention, the non-circular cross-section of the conduit has a cross-sectional elliptical shape.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 2A showing a cross-sectional view of a conduit with a substantially elliptic shape in Cartesian space, according to some embodiments of the present invention;

FIG. 2B showing a perspective view of the conduit with a substantially elliptic shape in Cartesian space, according to some embodiments of the present invention;

FIG. 3 schematically illustrates several conduits with varying cross-sectional elliptical eccentricity and surface roughness for use with the NMR-based measurement system, according to some embodiments of the present invention;

Figure 1:
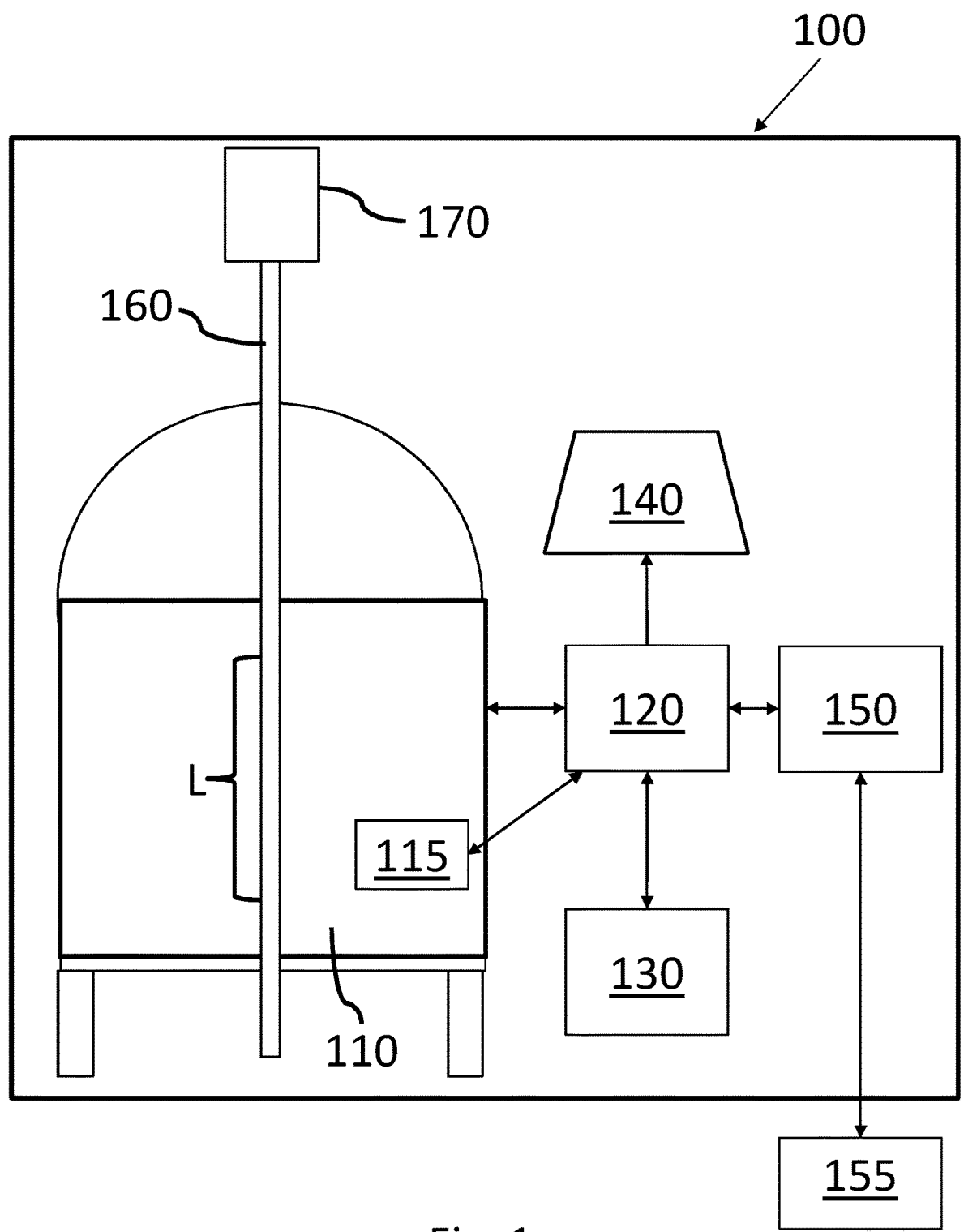
FIG. 1 schematically illustrates an NMR-based system for measuring physical properties of a fluid, according to some embodiments of the invention.

It will be appreciated that, for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of embodiments of the invention. However it will be understood by those of ordinary skill in the art that the embodiments of the invention may be practiced without these specific details. In other instances, well-known methods, procedures, and components have not been described in detail so as not to obscure the embodiments of the invention.

The following description is provided, alongside all chapters of the present invention, so as to enable any person skilled in the art to make use of said invention and sets forth the best modes contemplated by the inventor of carrying out this invention. Various modifications, however, will remain apparent to those skilled in the art, since the generic principles of the present invention have been defined specifically to provide a non-invasive, on-line means for measuring and controlling, at high precision, physical, electrochemical and/or chemical state transformation of a fluid substance in an industrial environment.

The terms "nuclear magnetic resonance" and "NMR" refer, in the present invention, to the physical phenomenon in which nuclei of a substance within a magnetic field absorb and re-emit electromagnetic radiation. This radiation is re-emitted by said substance at a resonance frequency determined by the strength of the magnetic field and the particular atomic structure of said substance. The term "NMR-based system" refers, in the present invention, to a device that generates a controlled nuclear magnetic resonance effect upon a substance and detects spectroscopic measurements of the resulting electromagnetic radiation.

The term "NMR image" refers, in the present invention, to the graphic representation of spectrometric/velocity/spatial imaging measurements of a cross-section obtained through NMR spectroscopy; the aggregation of which may be integrated to produce a 3-dimensional representation of NMR spectroscopic measurements. The term "non-invasive" refers in the present invention to the description of the operation of the disclosed invention itself as not affecting said substance being measured and not interrupting normal industrial processes involving said substance.

The term "laminar flow" refers, in the present invention, to the fluid dynamic characteristics of a fluid flowing in parallel layers, with no disruption between the layers. Laminar flow is also characterized by the manner in which its fluid's viscosity absorbs its kinetic energy. The term "turbulent flow" refers, in the present invention, to the fluid dynamic characteristics of a fluid flowing with significant disruption between its layers, which are characterized as not flowing in smooth, parallel layers. Turbulent flow is also characterized by the manner in which its kinetic energy is not absorbed by the viscosity of its fluid.

The term "surface roughness" refers, in the present invention, to the texture characteristic of a machined surface, this characteristic quantified by deviations in the direction of the normal vector of a real surface from its ideal form, whereby large deviations result in a rough surface and small deviations result in a smooth surface.

The term "on-line" refers, in the present invention, to the status of the system when its measurement functions are operational in real time and without a need for human intervention. The term "in-line" refers, in the present invention, to a measurement system that is configured as an integral part of a successive sequence of operations in an industrial process involving a fluid.

It should be noted that fluid dynamics indicate that the cross-sectional shape of a conduit may influence the size of its zone of laminar-turbulent flow transition, relative to conduits having other cross-sectional shapes. As such, the combination of NMR spectrometry technology with a system of flow conduits specifically chosen for their laminar-turbulent flow transition properties may provide valuable experimental and process control capabilities for determining a fluid's rheological and compositional properties.

Reference is now made to FIG. 1, schematically illustrating an NMR-based system 100 for measuring physical properties of a fluid (wherein the direction of arrows indicates an exemplary direction of information flow), according to some embodiments of the invention.

According to some embodiments, NMR-based system 100 may comprise an NMR spectrometer 110 that is configured to allow at least one of: subjecting a fluid to radio frequency (RF) signals within a generated magnetic field, measuring RF signals re-emitted by the fluid, and producing an NMR analyzed image of the fluid. In some embodiments, NMR-based system 100 may further comprise a computer processor 120 that is configured to allow control of RF wave generation and detection functions of NMR spectrometer 110, for instance with an RF generation module 115.

According to some embodiments, NMR-based system 100 may further comprise a computer-readable medium (CRM) 130 for storing machine instructions for computer processor 120 and/or for storing information pertaining to the measurement and analyzing of the RF signals. In some embodiments, CRM 130 may comprise computer readable code that when executed causes a plurality of steps to be executed by computer processor 120 for the analytic processing of data related to the physical properties of the fluid.

In some embodiments, NMR-based system 100 may further comprise a visual display 140 for indicating the current state and function of NMR-based system 100, for instance visual display 140 may be a computer screen of a PC. In some embodiments, NMR-based system 100 may further comprise a digital electronic connection port 150 that is configured to allow digital communication between NMR-based system 100 and a computer communication network 155, for instance computer communication network 155 may be wired or wireless network such as the Internet.

According to some embodiments, NMR-based system 100 may further comprise a conduit 160 that is configured to allow accommodation of the flow of the fluid, wherein conduit 160 may have a predetermined segment of non-circular cross-section. It should be appreciated that the properties of the non-circular cross-section of conduit 160 may result in predicted zones of laminar, turbulent, and mixed laminar-turbulent fluid flow therewithin.

According to some embodiments, NMR-based system 100 may further comprise a flow-inducing mechanism 170 that may be configured to allow flow generation of the fluids within conduit 160. In some embodiments, the flow may be induced under conditions of laminar and mixed laminar-turbulent flow through conduit 160 with non-circular cross-section.

According to some embodiments, measuring physical properties of a fluid with NMR-based system 100 may comprise analyzing a slice of predefined length, 'L', of conduit 160 in order to determine the amount of shear stress applied to each layer of fluid therewithin. It should be noted that shear stress in the conduit may have substantially linear behavior as a function of distance along the conduit, such that by measuring the pressure drop between two distant point, having a known distance within conduit 160 with NMR-based system 100, the shear rate may be determined.

According to some embodiments, the physical properties of a flowing substance measured by NMR-based system 100 may comprise at least one of the concentration and the identification of at least one material as well as said material's particle size, particle size distribution, particle shape, dynamic flow characteristics, and water content. In some embodiments, the physical properties of a flowing substance measured by NMR-based system 100 comprise electrochemical and/or chemical properties of conductivity, dielectric constant, and magnetic properties.

It should be appreciated that NMR-based system 100 may further be applied to the measurement of electrochemical and/or chemical state transformations of a flowing substance, said transformations comprising relative changes in the conductivity, dielectric constant, and magnetic properties of said substance.

According to some embodiments, measuring physical properties of a fluid with NMR-based system 100 may comprise subjecting said fluid to RF signals within a magnetic field generated by an NMR spectrometer 110, measuring RF signals re-emitted by the fluid with NMR spectrometer 110, and then producing an NMR image of said fluid. In some embodiments, the produced NMR image may comprise a three dimensional profile of flow velocity within the conduit, such that this velocity profile may allow characterization of the flow conditions as one of laminar, turbulent and mixed laminar-turbulent flow.

According to some embodiments, measuring physical properties of a fluid with NMR-based system 100 may comprise controlling the RF wave generation and detection functions of said NMR spectrometer using computer processor 120. In some embodiments, measuring physical properties of a fluid with NMR-based system 100 may comprise indicating the current state and function of the NMR imaging process on visual display 140.

According to some embodiments, measuring physical properties of a fluid with NMR-based system 100 may comprise storing machine implementable instructions for computer processor 120 on CRM 130 and storing information pertaining to the measurement of the RF signals on CRM 130, wherein computer processor 120 may execute instructions for processing data related to physical properties of the fluid under conditions of laminar and mixed laminar-turbulent flow through said conduit of non-circular cross-section.

According to some embodiments, measuring physical properties of a fluid with NMR-based system 100 may comprise facilitating digital communication between computer processor 120 and a computer communication network via a digital electronic connection port 150.

According to some embodiments, measuring physical properties of a fluid with NMR-based system 100 may comprise accommodating the flow of said fluid within said magnetic field using a conduit 160 with a predetermined segment of non-circular cross-section. In some embodiments, measuring physical properties of a fluid with NMR-based system 100 may comprise generating the flow of the fluids within conduit 160 using flow-inducing mechanism 170.

According to some embodiments, conduit 160 may have a length-section of elliptical cross-section having specific, combined attributes of cross-sectional elliptical eccentricity and inner surface roughness, which may produce specific conditions of laminar, turbulent, and mixed laminar-turbulent fluid flow zones within the conduit. It should be appreciated that these combined attributes may be operationally matched to parameters of the analytic processing of data by NMR-based system 100.

According to some embodiments, conduit 160 may comprise at least one conduit section of rectangular cross-section having specific, combined attributes of cross-sectional rectangular aspect ratio and inner surface roughness, producing specific conditions of laminar, turbulent, and mixed laminar-turbulent fluid flow zones within the conduit. It should be appreciated that these combined attributes may be operationally matched to parameters of said analytic processing of data by NMR-based system 100.

According to some embodiments, conduit 160 may comprise at least one conduit section of helical cross-section having specific, combined attributes of relative curvature and inner surface roughness, producing specific conditions of laminar, turbulent, and mixed laminar-turbulent fluid flow zones within the conduit. It should be appreciated that these combined attributes may be operationally matched to parameters of said analytic processing of data by NMR-based system 100.

Reference is now made to FIGS. 2A-2B, showing a cross-sectional and perspective views respectively of a conduit with a substantially elliptic shape in Cartesian space, with X-axis (major) radius 'a' and Y-axis (minor) radius 'b', according to some embodiments of the invention. It should be noted that using such geometry of elliptical conduits may be configured to allow both higher resolution and higher shear rate within the same flow loop. Namely, hardware components for NMR imaging of circular conduits may be utilized for imaging of non-circular conduits while achieving enhanced performance with a wider range of the shear rate, as further described hereinafter.

According to some embodiments, a substantially elliptical conduit may be one of a plurality of conduits having cross section with different values of elliptical eccentricity, 'e', ranging from a minimum of substantially zero to a maximum of about 0.98, where 'e' is defined by the expression, $$e = \sqrt{1 - \left(\frac{b^2}{a^2}\right)}$$

where 'a' is the conduit's radius along the X-axis, and 'b' is the conduit's radius along the Y-axis, operationally matched to parameters of the analytic processing of data, wherein 0≤b≤a. It should be noted that when e=0, the shape becomes circular.

It should be appreciated that with an elliptical conduit, for a Newtons fluid and under laminar flow, the flow profile may be defined as:

$$V(x, y) \propto \frac{V_{max} a^2 b^2}{(a^2 + b^2)} \left(1 - \frac{x^2}{a^2} - \frac{y^2}{b^2}\right)$$

It should be noted that imaging of a cross-sectional slice of the elliptical conduit through the center of the XY plane (perpendicular to the flow in the conduit), for instance acquired with magnetic resonance imaging (MRI), may provide a velocity profile coinciding with the laminar flow in a cylindrical conduit. For instance, setting y=0 (e.g. with the radius set as 'R'='a') may derive the velocity profile coinciding laminar flow in a cylindrical conduit:

$$V(r) = V_{max} \cdot \left(1 - \frac{r^2}{R^2}\right)$$

wherein analyzing of the physical properties of the fluid is known.

Furthermore, imaging of a second MRI slice across the center of the XY plane, now setting x=0 (e.g. with the radius set as 'R'='b'), may derive the velocity profile also coinciding laminar flow in a cylindrical conduit. Thus, by acquiring sequentially and/or simultaneously the two perpendicular MRI slices, it may be possible to achieve higher resolution along the 'X' axis (with 'R'='a'), and also achieve higher range of shear rates along the 'Y' axis (with 'R'='b'). It should be appreciated that with this method, NMR-based system may utilize NMR spectrometer 110 imaging elliptical conduit 160 with two sequential steps, wherein a first measurement analyzes a cylindrical conduit of radius 'a', and a second measurement analyzes a cylindrical conduit of radius 'b' while a single (elliptical) conduit is analyzed. It should be noted that conduits of other non-circular shapes may also be analyzed in a similar method wherein different fractions of the three-dimensional image (from the NMR-based system) may be processed. In some embodiments, in case that analyzing of such MRI slices indicated that the flow profile of one slice is non-laminar then it may be possible to analyze the other slice for laminar flow.

According to some embodiments, after the flow profile in the non-circular conduit is characterized, e.g. after analyzing with the computer processor, the dynamic range of the rheogram may be enlarged using the measured shear rate from the analyzed slices.

According to some embodiments, the non-circular cross-section of the conduit may be elliptical in cross-sectional shape, wherein the fluid velocity profile through the cross-section, $v_z$, may be described in Cartesian coordinates by the expression, $$v_z = \frac{2Q}{\pi ab} \left(1 - \frac{x^2}{a^2} - \frac{y^2}{b^2}\right)$$

where 'Q' is the rate of total flow of the fluid through the conduit, 'a' is the conduit's radius along the X-axis, and 'b' is the conduit's radius along the Y-axis. In some embodiments, the velocity differential at different x,y coordinates along the cross-section may correlate to relative laminar flow within the conduit.

Reference is now made to FIG. 3, schematically illustrates several conduits 310, 320, 330 with varying cross-sectional elliptical eccentricity and surface roughness for use with NMR-based measurement system 100, according to some embodiments of the invention.

Figure 4:
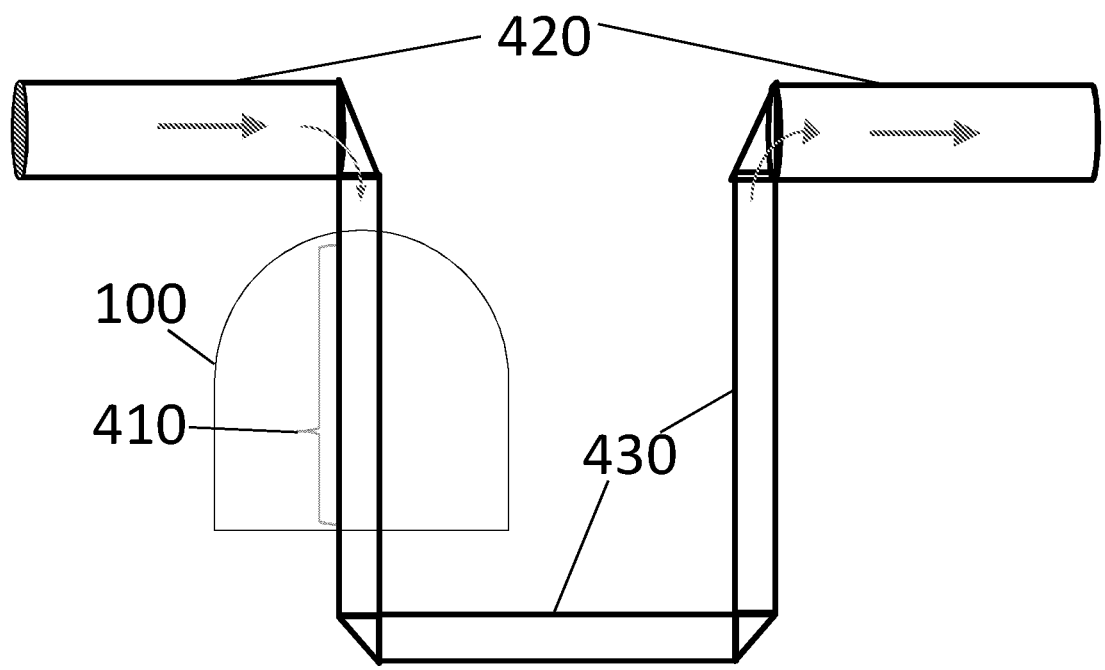
FIG. 4 schematically illustrates an NMR-based measurement system with a conduit of elliptical cross-section passing through it, configured in series with the regular fluid flow of an industrial process, according to some embodiments of the present invention.

Reference is now made to FIG. 4, schematically illustrating NMR-based measurement system 100 with a conduit of elliptical cross-section 410 passing through it, configured in series with the regular fluid flow of an industrial process 420, according to some embodiments of the invention.

According to some embodiments, conduit of elliptical cross-section 410 may be configured in-line, as an integral, serial part of an industrial process wherein said physical properties of the fluid may be measured.

According to some embodiments, conduit of elliptical cross-section 410 may be one of a plurality of conduits comprising inner walls 430 of various degrees of surface roughness, producing various levels of turbulence of the fluid flow within the conduit, and operationally matched to parameters of the analytic processing of data.

Figure 5:
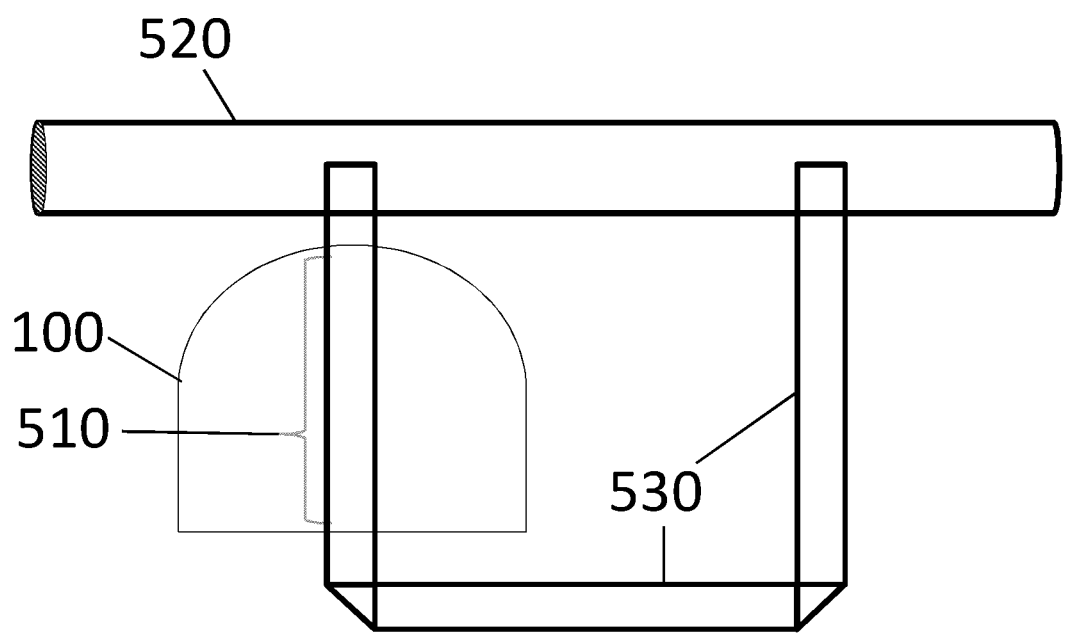
FIG. 5 schematically illustrates an NMR-based measurement system with a conduit of elliptical cross-section passing through it, configured in parallel to the regular fluid flow of an industrial process, according to some embodiments of the present invention.

Reference is now made to FIG. 5, schematically illustrates NMR-based measurement system with a conduit of elliptical cross-section 510 passing through it, configured in parallel to the regular fluid flow of an industrial process 520, according to some embodiments of the invention.

According to some embodiments, conduit of elliptical cross-section 510 may be configured on-line, accommodating a flow of the fluid that is parallel to the regular fluid flow 520 of an industrial process, i.e., wherein fluid may be siphoned off from said regular fluid flow and re-integrated into the regular fluid flow at a point past the monitoring point of NMR-based system 100.

In some embodiments, the dimensions of the non-circular conduit may correspond to the dimensions and resolution of the MRI of the NMR-based system. In some embodiments, the range of the radius of the non-circular conduit may be between 2 millimeters and 50 millimeters.

It should be appreciated that zones of the non-circular conduit having at least partially turbulent flow may require different dimensions of the conduit in order to apply the above method and/or application of further analyzing steps.

Figure 6:
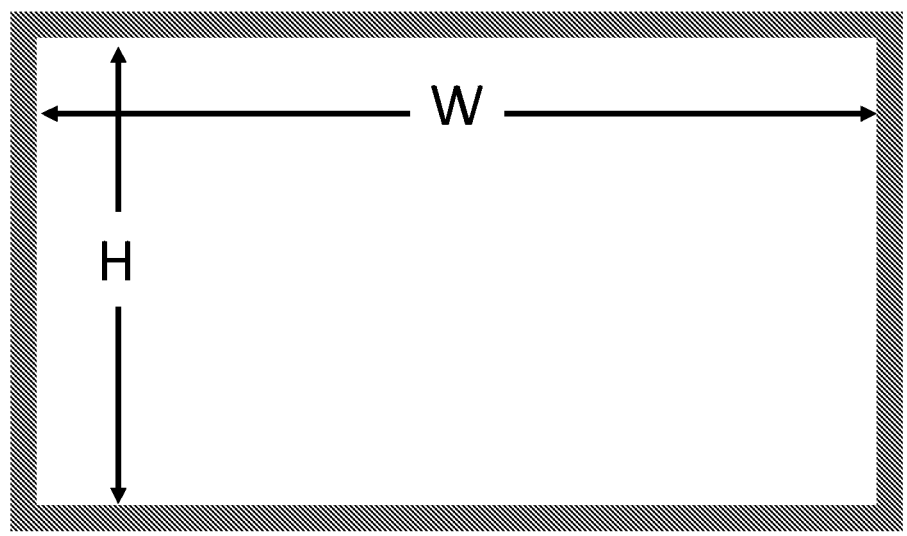
FIG. 6 shows a geometric depiction of a conduit's cross section as a rectangle with width 'W' and height 'H', according to some embodiments of the present invention.

Reference is now made to FIG. 6, shows a geometric depiction of a conduit's cross section as a rectangle in with width 'W' and height 'H', according to some embodiments of the invention. It should be noted that such a conduit may maintain the ration wherein O<H≤W.

According to some embodiments, conduit 160 (as shown in FIG. 1) may comprise at least two longitudinal conduit sections, wherein the rectangular aspect ratio (AR) of the longitudinal conduit sections ranges from a minimum value of about 1 to a maximum value of about 8, where 'AR' may be defined by the expression AR=W/H, where 'W' is the conduit's width, and 'H' is the conduit's height.

Figure 7:
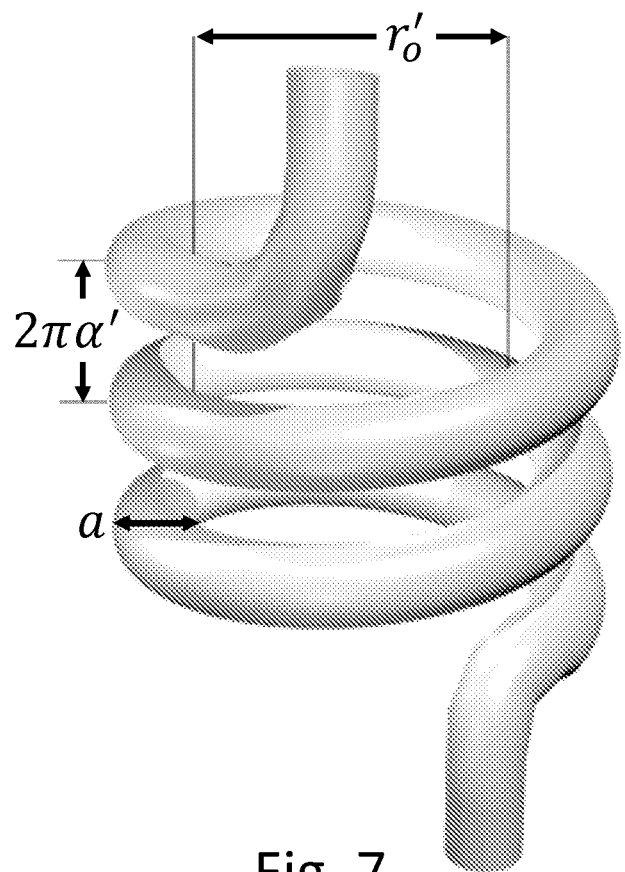
FIG. 7 schematically illustrates a helical conduit segment, according to some embodiments of the present invention.

Reference is now made to FIG. 7, schematically illustrates a helical conduit segment wherein 'a' is the inner width of the cross section of helical conduit, $2\pi\alpha'$ is the pitch of the helical conduit, and $r'_o$ is the cylindrical radius about which the helical conduit is wrapped, according to some embodiments of the invention.

According to some embodiments, conduit 160 may comprise at least two conduit sections with at least one conduit section of helical cross-section, wherein the helical curvature, δ, of said conduit sections ranges from a minimum of about 0.02 to a maximum of about 0.1, where δ is defined by the expression $$\delta = \frac{r'_o a}{r'^2_o + \alpha'^2},$$

where 'a' is the inner width of the cross section of helical conduit, $2\pi\alpha'$ is the pitch of the helical conduit, and $r'_o$ is the cylindrical radius about which the helical conduit is wrapped.

It should be appreciated that non-laminar flow of a helical conduit may be studied in order to analyze additional flow patterns, of non-laminar flow.

In some embodiments, the NMR-based system may continuously monitor a water supply on-line, with a parallel feed flow pumped from a city reservoir. The system may be calibrated with the resonance frequency of potable water as well as the resonance frequencies and electromagnetic spin characteristics of a predetermined list of toxic contaminants. The system may then issues a warning alarm when the fluid's resonance frequency deviates from within standard acceptable resonance frequency range, or when at least one of the contaminants on the list of toxic contaminants is detected. Furthermore, the NMR-based system may measure a cross-sectional zone of laminar-turbulent transition within the water's flow in order to increase the separation of component substances and maximize the system's overall detection effectiveness. It should be noted that conduits having non-circular configurations (e.g. elliptic configuration) may allow analysis of toxic contaminants, similarly to analysis carried out in cylindrical circular conduits, for example using magnetic resonance spectroscopy (MRS).

Figure 8:
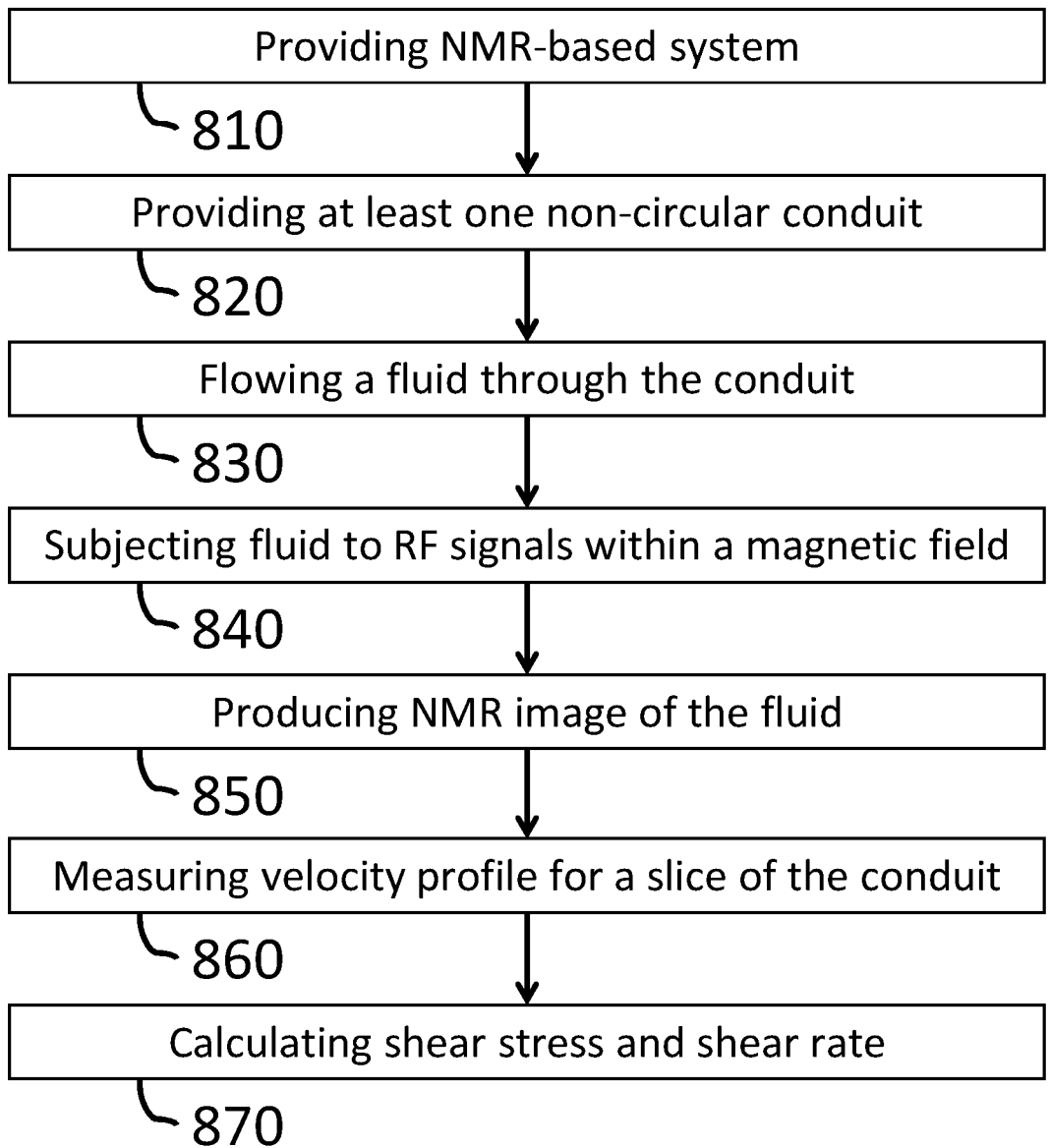
FIG. 8 shows a flow chart for NMR imaging of fluids in non-circular cross-sectional conduits, according to some embodiments of the present invention.

Reference is now made to FIG. 8, showing a flow chart for NMR imaging of fluids in non-circular cross-sectional conduits, according to some embodiments of the invention. Initially, NMR-based system may be provided 810 for imaging of at least one non-circular cross-sectional conduit 820. Next, a fluid may be flown 830 through the non-circular cross-sectional conduit, for instance using a flow inducing mechanism 170 (as shown in FIG. 1).

The fluid may then be subjected 840 to radio frequency (RF) signals within the magnetic field, for instance generated by RF generation module 115 (as shown in FIG. 1), in order to measure re-emitted signals with NMR spectrometer 110 so as to produce 850 an NMR image of the fluid within the conduit.

The velocity profile of the non-circular cross-sectional conduit may be measured 860 for a predefined length of a slice of the conduit, for instance with the methods discussed above for elliptical conduits. Next, the shear rate and shear stress may be calculated 870 for the conduit, for instance producing a rheogram.

In some embodiments, the NMR-based system may be configured to allow measurement of the rheological properties, including viscosity, of the fluid flowing in a production process, for instance production of ketchup. The NMR-based system may be calibrated and adjusted to a resonance frequency associated with a desired fluid profile (e.g. ketchup profile). It should be noted that on-line measurement may be continuously performed on the stream (e.g. of ketchup) and an alert may be activated if the system detects a fluid viscosity deviation greater than a predetermined percent (for instance greater than 0.5%) from the calibrated viscosity value.

Furthermore, the NMR-based system may be configured to allow measurements of a cross-sectional zone of laminar-turbulent transition within the flow at the production line. This may be carried out in order to isolate and identify any ingredients which have failed to completely assimilate into the fluid matrix. As such, product consistency and quality control may be maximized.

It should be appreciated that in the petroleum exploration industry, rheological and compositional properties of drilling fluid, circulated down the drilling conduit and back up the annulus of the surrounding borehole, provide essential process control information. This information often results in real time process changes in the composition of the drilling fluid or in drilling parameters such as drilling speed and weight-on-bit. In some situations, the circulated drilling fluid's properties may provide information about the geological structural formation. For example, some geological structures are associated with greater potential for drilling bottom-hole assemblies becoming stuck. When such conditions are detected, special procedures are to be employed in order to prevent the drill string from getting stuck. Therefore, an NMR-based system may be utilized at an oilfield drilling rig site, so as to allow measurements of the rheological properties, including viscosity, of the drilling fluid.

It should be appreciated that utilizing NMR-based systems for analyzing of distilled substances may also be advantageous. Distilled substances may include, but are not necessarily limited to, alcoholic beverages and manufactured chemicals, including petrochemicals. In the beverage distilling industry, alcoholic substances are gathered from various sources, including but not limited to grains, vegetables, and fruits. In the petrochemical industries, automotive and aviation fuel are two examples of products whose distillation characteristics may be critical to the quality of the end product. Distillation characteristics in aviation fuel, for instance, may affect starting, warm-up, and the tendency to vapor lock at high operating temperatures, high altitude, or both. As such, distillation limits are often included in petroleum product specifications, commercial contract agreements, process refinery/control applications, and compliance to industry/product regulations.

In some embodiments, an NMR-based system may be configured for measuring rheological properties of fluids as well as water content and the quality of the fluid as compared against standard reference substances on the basis of resonance frequencies, for instance as part of quality control within a distillation system/process. The fluid may undergo NMR imaging as it passes through the condensation process, for instance involving flow through a section of helical conduit.

Unless explicitly stated, the method embodiments described herein are not constrained to a particular order in time or chronological sequence. Additionally, some of the described method elements may be skipped, or they may be repeated, during a sequence of operations of a method.

Various embodiments have been presented. Each of these embodiments may of course include features from other embodiments presented, and embodiments not specifically described may include various features described herein.

The invention claimed is:

1. A nuclear magnetic resonance (NMR)-based system for measuring physical properties of a fluid, the system comprising:
    an NMR spectrometer, configured to subject said fluid to radio frequency (RF) signals within a generated magnetic field, measure RF signals re-emitted by said fluid, and produce an NMR image of said fluid;
    a computer processor, configured to control of the RF wave generation and detection functions of said NMR spectrometer;
    a conduit, with a at least one segment of elliptical cross-section configured to accommodate the flow of said fluid; and
    a flow-inducing mechanism, configured to generate said flow of said fluid within said conduit,
    wherein:
        said computer processor is configured to analytically process data related to the physical properties of the fluid under conditions of laminar and mixed laminar-turbulent flow through said segment and to shear stress and shear rate of the fluid; and
        the fluid velocity profile through said cross-section, vz, is described by the expression, $$v_z = \frac{2Q}{\pi ab}\left(1 - \frac{x^2}{a^2} - \frac{y^2}{b^2}\right),$$

in Cartesian coordinates, where Q is the rate of total flow of the fluid through said cross-section, "a" is the radius along the x-axis of said cross-section, and "b" is the radius along the y-axis of said cross-section, and the velocity differential at different x,y coordinates along the cross-section correlates to laminar flow within said conduit.

2. The NMR-based system of claim 1, wherein the computer processor is configured to fit the physical parameters of said conduit to parameters of a circular conduit, and analyze flow in a circular conduit.

3. The NMR-based system of claim 1, further comprising:
    a computer-readable medium having machine instructions stored thereon capable of being executed by said computer processor and configured to store information pertaining to the measurement of said RF signals; and
    a digital electronic connection port configured to provide digital communication between said NMR-based system and a computer communication network,
        wherein said machine instructions are executed, they cause the computer processor to perform the analytic processing of data related to the physical properties of the fluid under conditions of laminar and mixed laminar-turbulent flow through said segment.

4. The NMR-based system of claim 1, further comprising a visual display configured to indicate the current state and function of said NMR-based system.

5. The NMR-based system of claim 1, wherein the radius of said conduit is in the range of 2-50 millimeters.

6. The NMR-based system of claim 1, wherein the physical properties of a flowing substance measured by said NMR-based system comprise at least one of the concentration and the identification of at least one material as well as said material's particle size, particle size distribution, particle shape, dynamic flow characteristics, water content, electrochemical and/or chemical properties of conductivity, dielectric constant, and magnetic properties.

7. The NMR-based system of claim 1, wherein the specification of said cross-section of said conduit results in predicted zones of laminar, turbulent, and mixed laminar-turbulent fluid flow within said conduit.

8. The NMR-based system of claim 1, wherein the conduit is configured on-line, accommodating a flow of said fluid that is parallel to the fluid flow of an industrial process.

9. The NMR-based system of claim 1, wherein the conduit is configured in-line, as an integral, serial part of an industrial process wherein said physical properties of said fluid are monitored.

10. The NMR-based system of claim 1, wherein the elliptical eccentricity, e, of the segment is greater than 0 and less than or equal to 0.98.

11. The NMR-based system of claim 1, wherein said segment comprises an inner wall having a surface roughness that produces a level of turbulence of the fluid flow within said conduit that is operationally matched to parameters of said analytic processing of data.

12. The NMR-based system of claim 1, further comprising an RF generation module that is configured to generate RF signals.

13. The method of claim 1, wherein said segment comprises an inner wall having a surface roughness that produces a level of turbulence of the fluid flow within said conduit that is operationally matched to parameters of said analytic processing of data.

14. A method for measuring physical properties of a fluid with a nuclear magnetic resonance (NMR)-based system with a conduit having at least one segment of elliptical cross-section, the method comprising:
    accommodating the flow of said fluid within said conduit,
    subjecting said fluid to radio frequency signals within a magnetic field generated by an NMR spectrometer,
    measuring radio frequency signals re-emitted by said fluid with said NMR spectrometer,
    producing an NMR image of said fluid; and
    processing data related to physical properties of the fluid flow through said segment to characterize the flow conditions as one of laminar, turbulent and mixed laminar-turbulent flow,
    wherein the fluid velocity profile through said cross-section, vz, is described by the expression, $$v_z = \frac{2Q}{\pi ab}\left(1 - \frac{x^2}{a^2} - \frac{y^2}{b^2}\right),$$

in Cartesian coordinates, where Q is the rate of total flow of the fluid through said cross-section, "a" is the radius along the x-axis of said cross-section, and "b" is the radius along the y-axis of said cross-section, and the velocity differential at different x,y coordinates along the cross-section correlates to laminar flow within said conduit.

15. The method of claim 14, wherein the processing includes measuring the shear stress and shear rate of the fluid.

16. The method of claim 14, wherein the produced NMR image comprises a three dimensional profile of flow velocity within the conduit.

17. The method of claim 14, further comprising fitting the physical parameters of said conduit to parameters of a circular conduit, and analyzing flow in a circular conduit.

18. The method of claim 14, further comprising:
generating said flow of said fluid within said conduit using a flow-inducing mechanism;
controlling the RF wave generation and detection functions of said NMR spectrometer using a computer processor that is executing machine instructions stored on a computer readable medium;
storing information pertaining to the measurement of said RF signals on said computer-readable medium; and
facilitating digital communication between the computer processor and a computer communication network via a digital electronic connection port.

19. The method of claim 18, further comprising indicating the current state and function of the NMR imaging process on a visual display.

20. The method of claim 14, further comprising generating radio frequency signals with a radio frequency generation module.

21. The method of claim 14, wherein said processing data related to the measured physical properties of a flowing substance comprises at least one of determining the concentration and the identification of at least one material as well as said material's particle size, particle size distribution, particle shape, dynamic flow characteristics, water content, electrochemical and/or chemical properties of conductivity, dielectric constant, and magnetic properties.

22. The method of claim 14, wherein the conduit is configured on-line, accommodating a flow of said fluid that is parallel to the fluid flow of an industrial process.

23. The method of claim 14, wherein the conduit is configured in-line, as an integral, serial part of an industrial process wherein said physical properties of said fluid are monitored.

24. The method of claim 14, wherein the elliptical eccentricity, e, of the segment is greater than 0 and less than or equal to 0.98.

* * * * *